United States Patent [19]

Masumi

[11] Patent Number: 5,140,002
[45] Date of Patent: Aug. 18, 1992

[54] PHOTOCONDUCTIVE-SUBSTANCE OF THE Y-BA-CU-O SYSTEM AND A METHOD FOR PRODUCING THE SAME

[75] Inventor: Taizo Masumi, Yokohama, Japan

[73] Assignee: The University of Tokyo, Tokyo, Japan

[21] Appl. No.: 696,999

[22] Filed: May 3, 1991

Related U.S. Application Data

[60] Continuation of Ser. No. 341,446, Apr. 21, 1989, abandoned, which is a division of Ser. No. 244,240, Sep. 14, 1988, abandoned.

[30] Foreign Application Priority Data

Feb. 4, 1988 [JP] Japan .................................. 63-22691

[51] Int. Cl.$^5$ ...................... C01B 13/14; C01F 17/00; C01G 3/02; G03G 5/00
[52] U.S. Cl. .................................... 505/1; 252/501.1; 252/518; 252/521; 505/742; 505/733; 430/86; 430/135
[58] Field of Search ........................ 423/593, 604, 635; 505/1, 742, 733; 252/518, 501.1, 521; 430/56, 86, 135

[56] References Cited

PUBLICATIONS

Johnson "Fabrication of Ceramic Articles from High--$T_c$..." MRS Proceedings. Apr. 23-24, 1987 p. 193-195.
Nakahara "On the Defect Structure of Grain..." Mat. Res. Soc. Symp. vol. 94 Dec. 1987 pp. 575-578.
Cava "Superconductivity at 91K in Single-Phase Oxygen-..." Phys. Rev. Letts. vol. 58 No. 16 Apr. 20, 1987 p. 1676-1679.
Nakamura "Oxygen Deficiency and Superconducting..." MRS Conference Proc. vol. 94 Apr., 1987 p. 240-242.
Noto "High Field Properties of Superconducting $Y_x$-$Ba_{1-x}$Cu-Oxides" Jap. Jnl. of Appld. Phys. vol. 26, No. 5 May 1987 p. L802-803.
Syono "X-ray and electron microscopic study of a high ..." Jap. Jnl. of Appld. Phys. vol. 26, No. 4 Apr., 1987, pp. L498-L501.
Qadri "X-ray identification of the superconductivity high-$T_c$..." Physical Review B vol. 35, No. 13 May 1, 1987 p. 7235-7237.
Ishizawa "Superconducting Properties of Highly Oxidized..." Jap. Jnl. Appl. Phys. vol. 26, No. 5 May 1987 p. L676-L677.
Iguchi "Structural and Superconducting Properties of $YBa_2Cu_3O_{7-\delta}$..." Jap. Jnl. of Appld. Phys. vol. 27, No. 6, Jun., 1988 pp. L992-L995.
Zimmerman "Operation of a Y-Ba-Cu-O rf Squid at 81K", Appl. Phys. Lett. 51 (8) Aug. 24, 1987 pp. 617-618.
Kumakura "Large Magnetization in $YBa_2Cu_3O_7$ Prepared by..." Jpn. Jnl. of Applied Phys. vol. 27, No. 2 Feb., 1988 pp. L188-L190.
Tajima "Composition Dependence of the Physical Properties..." Jap. Jnl. Appl. Phys. vol. 26(5) May 1987 pp. L845-L847.
Bankuti "High Tc Superconducting in Metallic Oxide Compounds" Jap. Jnl. Appl. Phys. Supplement vol. 26(8) Aug. 1987 p. 1073-1074.
Fitzner "Thermodynamic Stability of the Y-Ba-Cu-Oxide..." Ext. Abst.: High Tc Super. II Ed.: Capore et al. Apr. 1988 pp. 285-288.
Rao "Superconductivity Studies on the High Tc Phase..." Jap. Jnl. Appl. Phys. vol. 26 1987 p. 26-27.

Primary Examiner—Paul Lieberman
Assistant Examiner—John Boyd
Attorney, Agent, or Firm—Sughrue, Mion, Zinn, Macpeak & Seas

[57] ABSTRACT

The disclosed substance has a general chemical formula of $Y_{3-x}$—$Ba_xCu_y$—$O_z$, x being 0 to 1, y being 3 to 6, and z being 6 to 12. At a temperature below 90°-95° K., the disclosed substance shows superconductive photoconductivity or even both superconductivity, either real or potential, and photoconductivity in response to incident exciting light in a wavelength range of 420 to 640 nm. The substance is produced by heating a mixture of starting material therefor at 750°-1,050° C. for 1-10 hours so as to cause solid phase reaction, cooling gradually, shaping under pressure, sintering at 670°-1,050° C., and cooling either quickly at a rate of 2,000°-900° C./sec or slowly at a rate of 150°-200° C./hour.

3 Claims, 5 Drawing Sheets

FIG_1A
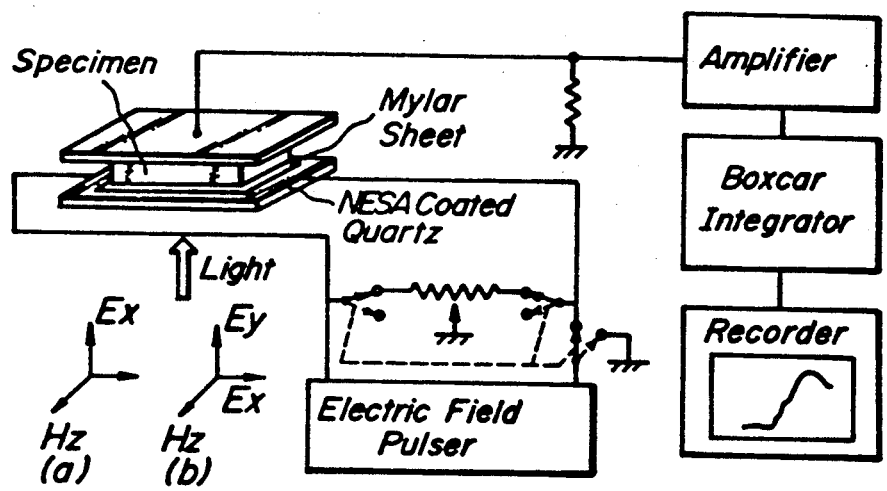
FIG_1B
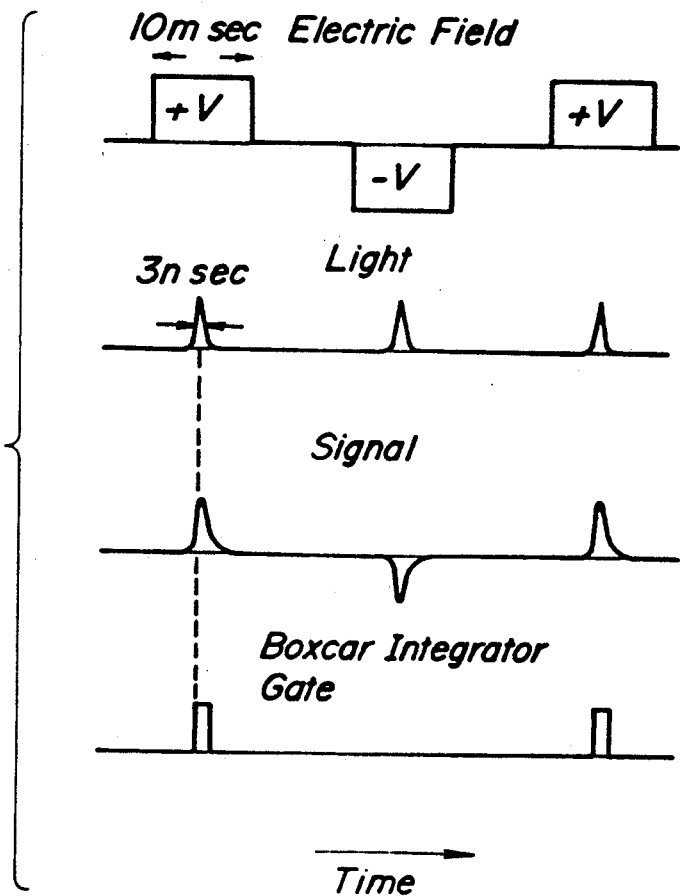

FIG_3A
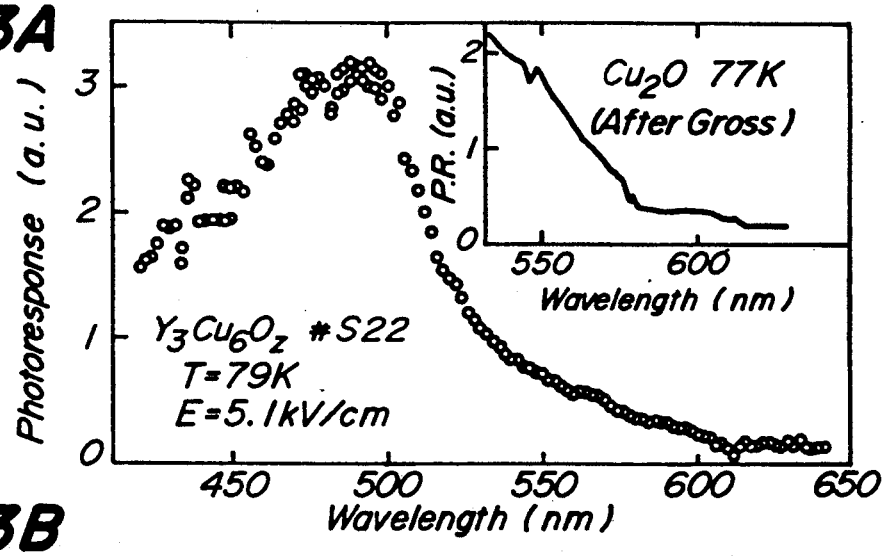
FIG_3B
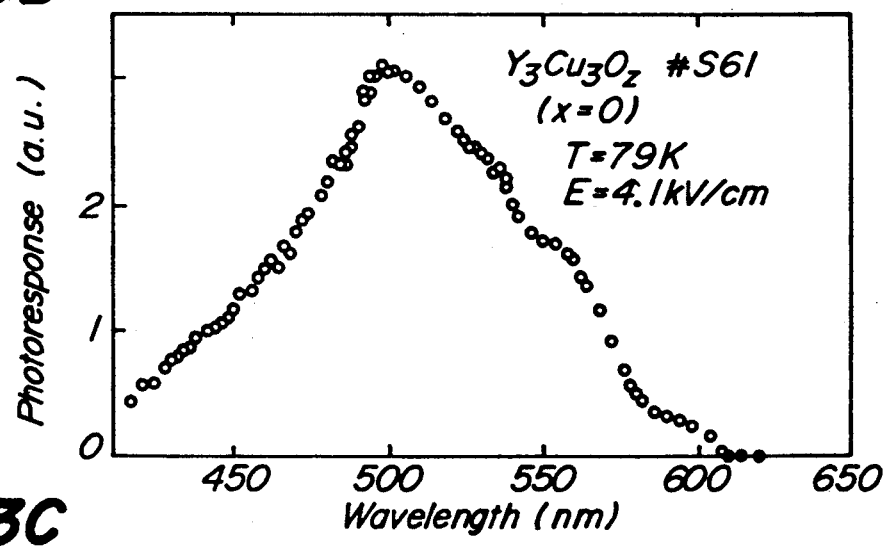
FIG_3C
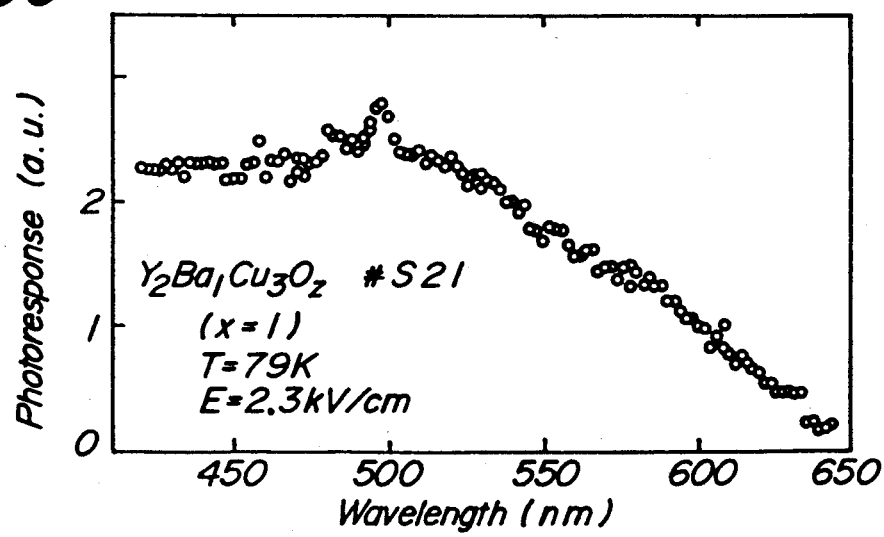

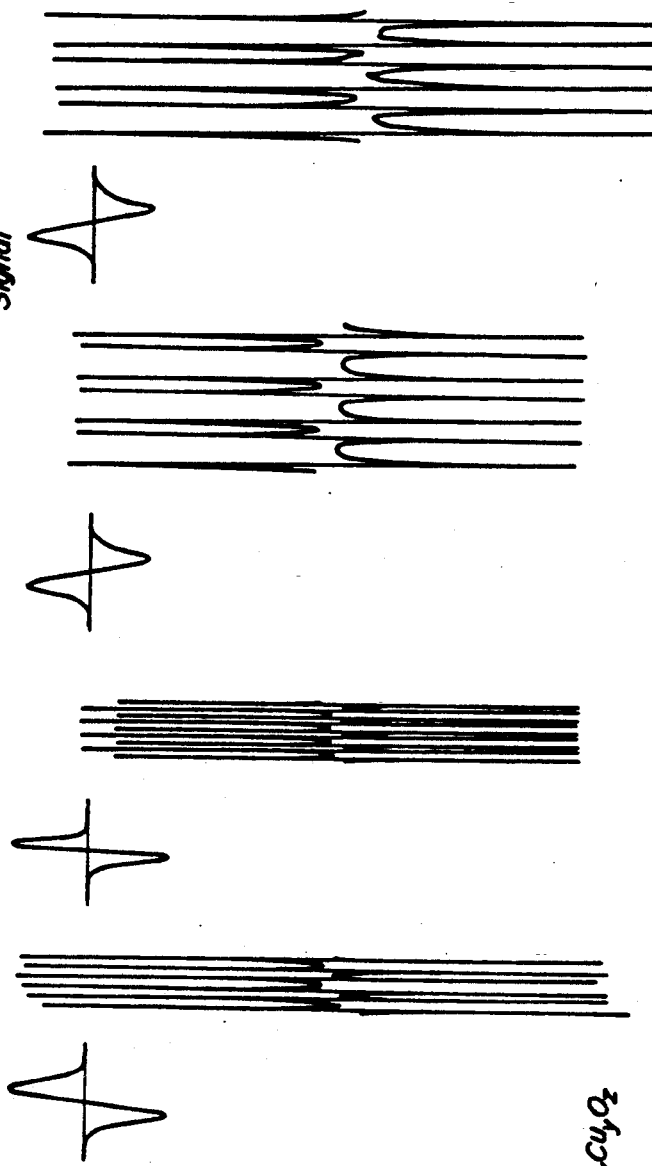

PHOTOCONDUCTIVE-SUBSTANCE OF THE Y-BA-CU-O SYSTEM AND A METHOD FOR PRODUCING THE SAME

This is a continuation of Ser. No. 07/341,446, filed Apr. 21, 1989, now abandoned, which is a division of application Ser. No. 07/244,240, filed Sept. 14, 1988 now abandoned.

BACKGROUND OF THE INVENTION

1. Field of the Invention

This invention relates to superconductive photoconductive-substance of the Y—Ba—Cu—O system defined to be photoconductive substance correlative with superconductivity whose composition is outside but includes even areas continuously close to that of regular oxide superconductors. Experiments on the optical properties, especially on the photoconduction in response to high-speed pulses, e.g. a pulsed light out of a dye laser, of substance with a chemical formula of $Y_{3-x}$—$Ba_x$—$Cu_y$—$O_z$ revealed an unexpected correlation between the superconductivity and the photoconductivity of the substance.

The invention also relates to a method for producing substance with a chemical formula of $Y_{3-x}$—$Ba_x$—$Cu_y$—$O_z$, in which method either x and y of the chemical formula are controlled for instance by varying x from 0 to 2 while keeping y=3, or z of the chemical formula is controlled by quick cooling or slow cooling while keeping x and y constant such as x=2 and y=3. When the substance has a low value of x near x=0 or is cooled quickly, the substance becomes a photoconductive insulator or semiconductor. On the other hand, when the substance has a value of x near x=1 and is cooled slowly, the substance becomes a photoconductive superconductor.

The substance in the invention is expected to be useful in developing a new industrial field of "Superconductive Opto-Electronics".

2. Related Art Statement

There has been no publications on such a system of substance which has superconductive photoconductivity or both superconductivity and inherent photoconductivity.

Conventional superconductors are metals or alloys in the main. Recently, much attention has been paid to high-temperature oxide superconductors, such as superconductors of the Y—Ba—Cu—O group, and considerable amounts of additives such as barium (Ba) and strontium (Sr) are used to raise the superconductive critical temperature ($T_c$). Studies and measurements on the optical properties of the superconductors at and in the proximity of visible wavelengths have been limited to the study of reflection and scattering of light therefrom due to a part of the metallic properties of such substance.

It has been believed that light is simply reflected from or scattered by the surface of a superconductor and is not allowed to enter therein. Study of optical properties, except the phenomena of reflection and scattering, has been treated as a completely different field from that of superconductivity in academic institutions, domestic and abroad, and in international conferences.

On the other hand, if any substance having superconductive photoconductive capability or even both superconductive capability and photoconductive capability at the boundary compositions is produced, a number of new electronic and optoelectronic devices may be developed; for instance, a superconductive phototransistor, a "superconductive optical computer" with a combined characteristics of the "superconductive computer" based on the currently studied Josephson devices and the "optical computer" proposed in optoelectronics, "superconductive optical fiber", and the like.

SUMMARY OF THE INVENTION

Therefore, an object of the present invention is to provide superconductive photoconductive-substance which reveals superconductive photoconductivity or both superconductivity and photoconductivity at a temperature below its critical temperature for superconductivity.

The superconductive photoconductive-substance according to the invention has a general chemical formula of $Y_{3-x}$—$Ba_x$—$Cu_y$—$O_z$, x being 0 to 1, y being 3 to 6, and z being 6 to 12. The substance of the invention shows superconductive photoconductivity or even both superconductivity and photoconductivity at a temperature below 90–95 K, the photoconductivity being valid in a wavelength range of 420 to 640 nm. The superconductivity of the substance of the invention may be either potential or real.

Another object of the present invention is to provide a method for producing the above-mentioned superconductive photoconductive-substance which reveals superconductive photoconductivity or even both superconductivity and photoconductivity at a temperature below its critical temperature for superconductivity.

With a method according to the invention for producing the superconductive photoconductive-substance with a general chemical formula of $Y_{3-x}$—$Ba_x$—$Cu_y$—$O_z$, x being 0 to 1, y being 3 to 6, and z being 6 to 12 a mixture of starting materials for a composition of the above-mentioned chemical formula is heated at 750°–1,050° C. for 1–10 hours so as to cause solid phase reaction in the mixture. The heated mixture is cooled gradually after that the cooled mixture is shaped under pressure. The shaped mixture is sintered at 670°–1,050° C., and then cooled either quickly at a rate of 2,000°–900° C./sec or slowly at a rate of 150°–200° C./hour. The substance thus produced reveals superconductive photoconductivity or both superconductivity and photoconductivity.

The reason for limiting the composition of the substance of the invention to the above-mentioned general chemical formula is in that the substance of such composition reveals superconductive photoconductivity or even both superconductivity and photoconductivity provided that it is treated by the method of the invention; namely, the method comprising steps of heating at 750°–1,050° C. for 1–10 hours so as to cause solid phase reaction in a starting material mixture, cooling gradually the heated mixture, shaping the cooled mixture under pressure, sintering the shaped mixture at 670°–1,050° C., and cooling the sintered substance either quickly at a rate of 2,000°–900° C./sec or slowly at a rate of 150°–200° C./hour.

The inventors have found that, in the substance with a general chemical formula of $Y_{3-x}$—$Ba_x$—$Cu_y$—$O_z$, if x is zero (x=0) or close to zero, the substance becomes insulating and shows semiconductive properties as well as photoconductive properties for certain wavelengths of light. On the other hand, if x departs from 0 and increases toward 2, the superconductive properties of the substance becomes more apparent while the photoconductive properties of the substance is maintained. It is noted that when the composition of a substance is such that $x=2$, $y=3$ and z is 6.75 to 6.97 in the chemical formula of $Y_{3-x}$—$Ba_x$—$Cu_y$—$O_z$, the substance with such composition shows only superconductive properties, so that such composition is excluded from the scope of the composition of the invention.

Of the substance according to the invention, substance of insulating type has for instance $x=0$, $y=3-6$ and z of 7.5 to 12 in the above chemical formula, while substance of superconductive type has for instance $x=2$, $y=3$ and z of 6.5 to 6.97 in the above chemical formula. It is an important finding of the inventor that even the above substance of insulating type has such photoconductivity which depends both on temperature and wavelength of exciting light, and the manner of its dependence on temperature and wavelength suggests a potential correlation with superconductivity in the insulating type substance. The present invention is based on such finding.

BRIEF DESCRIPTION OF THE DRAWINGS

For a better understanding of the invention, reference is made to the accompanying drawings, in which:

FIG. 1A is a simplified block diagram showing principles of a photoconductivity [(a) dotted arrows] and the Hall effect [(b) solid arrows] measuring circuit which uses blocking electrodes and light pulses;

FIG. 1B illustrates a time sequence charts showing waveforms of signals in the circuit of FIG. 1A;

FIG. 3A is a graph showing the wavelength-dependence of photoconductive response $Q(\lambda, T)$ of the superconductive photoconductive-substance with $Y_{3-x}$—$Ba_x$—$Cu_y$—$O_z$ for the case of $x=0$, $y=6$ and $z\simeq10.5$;

FIG. 3B is a similar graph of FIG. 3A except for the case of $x=0$, $y=3$ and $z\simeq b$ 7.5;

FIG. 3C is a similar graph as FIG. 3A except for the case of $x=1$, $y=3$ and $z\simeq6.6$;

FIGS. 4A, 4B, 4C and 4D show waveforms of signals induced and transferred by a signal detecting coil to the microwave SQUID for different specimens of the substance $Y_{3-x}$—$Ba_x$—$Cu_y$—$O_z$, which waveforms represent the positive or negative sign and magnitude of magnetization in the specimens;

DESCRIPTION OF THE PREFERRED EMBODIMENT

Figure 2A:
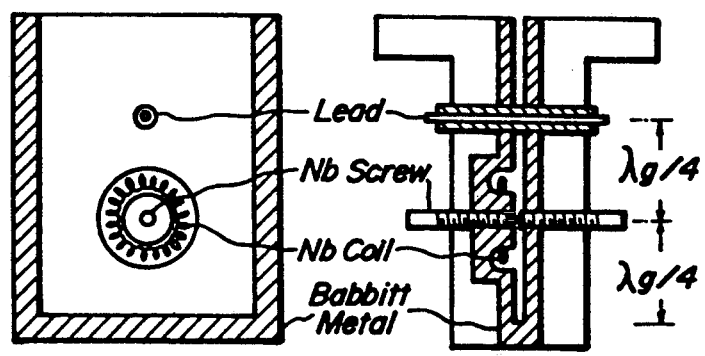
FIG. 2A shows sectional views of an essential part of a static susceptibility measuring device using a microwave SQUID (Superconducting Quantum Interference Device)

Most of conventional oxide compounds such as $Y_3$—$Cu_6$—$O_z$ (z being 6 to 12) and $Y_{3-x}$—$Ba_x$—$Cu_3$—$O_z$—y are normally semiconductors at the ground state, e.g., at low temperatures and in the dark. An elementary excitation can be created by giving the many-body ground state an appreciable amount of energy with relevant magnitude of momentum. Usually, for superconductors, these excitations beyond the energy gap destroy the superconductive ground state in the BCS theory. There is a possibility, however, to create a coherent state of elementary excitations above the ground state of insulating semiconductors such as bipolarons and excitons even in a thermally non-equilibrium state. We have found a new substance as an outcome of studies in fundamental physics and applied physics from the standpoint of the elementary excitation concept, in a sense parallel to, but rather orthogonal to the trend of studies of high-$T_c$ (critical temperature) superconductors. Namely, our finding relates to substance whose composition does not result in perfect superconductor, but the substance has a composition close to that of superconductor and reveals superconductive photoconductivity or even both superconductivity and photoconductivity. The present invention has been completed based on that finding.

The invention will be described in further detail by referring to embodiments.

EMBODIMENTS

The composition of the substance found by the inventor can be expressed by a chemical formula of $Y_{3-x}$—$Ba_x$—$Cu_y$—$O_z$. The inventor has tried to seek into details of the complete scheme of a phase diagram of $Y_{3-x}$—$Ba_x$—$Cu_y$—$O_z$.

A large number of specimens of Y—Cu—O and Y—Ba—Cu—O systems were made from the powders of $Y_2O_3$, $BaCO_3$ and $CuO$ by using the method already described in numerous references. For instance, primary sintering of a mixture of starting materials for a composition of said chemical formula was effected at 750°–1,050° C. for 1–10 hours so as to cause solid phase reaction in the mixture. After being cooled gradually, the sintered mixture was shaped under pressure, and secondary sintering was effected at 670°–1,050° C. The specimens were then annealed at 600°–700° C. and cooled slowly. The composition of the starting material was studied in detail, and the composition of the specimen was selected to be close to regular superconductors in such a manner that it became more or less controllable in a range outside that of the latter. Besides, the value of z in the above chemical formula was controlled by carefully regulating the method and speed of cooling.

Specimens No. S20, No. S21 and No. S22 were prepared in the above-mentioned manner.

Specimen No. S61 with a composition of $Y_3$—$Cu_3$—$O_{7.5}$ was prepared by primary sintering of a starting mixture of the above composition at 1,000°–1,050° C. for 2 hours, slow cooling, shaping under pressure, secondary sintering at 1,000°–1,050° C. for 2 hours, cooling, annealing at 700° C. for 2 hours, and slow cooling.

Since specimens of the $Y_3$—$Cu_3$—$O_z$, $Y_3$—$Cu_6$—$O_z$ and $Y_{3-x}$—$Ba_x$—$Cu_y$—$O_z$ systems within a certain part of the values of x, y and z became highly insulating or at least semiconducting at low temperatures, the conventional techniques for resistivity measurements encountered several serious difficulties, especially such as those associated with the non-ohmic contact electrodes, the build-up of space charge and with the low signal-to-noise ratio due to low carrier density in high-impedance materials.

In the experiments of the inventor, two types of techniques were adopted for resistivity or/and conductivity measurements. First, for insulating specimens ($\rho \geq 10^8$ $\Omega \cdot$cm) such as No. S22, a fast pulse technique with blocking electrodes as shown in FIG. 1A was adopted. Referring to FIG. 1B, the difficulties noted above were overcome by using a pulsed dye laser of 3 ns width at a repetition rate of 13 Hz in the dark synchronized with pulse electric fields up to E$\simeq$5 kV/cm of 10 ms duration for measuring photoresponse, as shown in FIG. 1B. Second, for moderately conducting specimens ($\rho \geq (10^{-2}-10^{-1})\Omega \cdot$cm) at 300 K such as specimens No. S20 and No. S21, resistivity measurements were performed by adopting the usual four-probe method in the dark without using any light.

The specimen No. S20 was made by mixing 0.40 g of $Y_2O_3$, 1.40 g of $BaCO_3$ and 0.85 g of CuO, and sintering the mixture. The specimen No. S61 was made by mixing 2.26 g of $Y_2O_3$ and 1.59 g of CuO, and sintering the mixture so as to produce $Y_3$—$Cu_3$—$O_z$. The specimen No. S21 was made by mixing 0.40 g of $Y_2O_3$, 0.35 g of $BaCO_3$ and 0.425 g of CuO, and sintering the mixture so as to produce $Y_2$—$Ba_1$—$Cu_3$—$O_z$. The specimen No. S22 was made by mixing 0.72 g of $Y_2O_3$ and 1.00 g of CuO, and sintering the mixture so as to produce $Y_3$—$Cu_6$—$O_z$. Here, z represents the amount of oxygen in the substance, and it varies depending on the sintering conditions so as to produce a variety of final products.

Figure 2B:
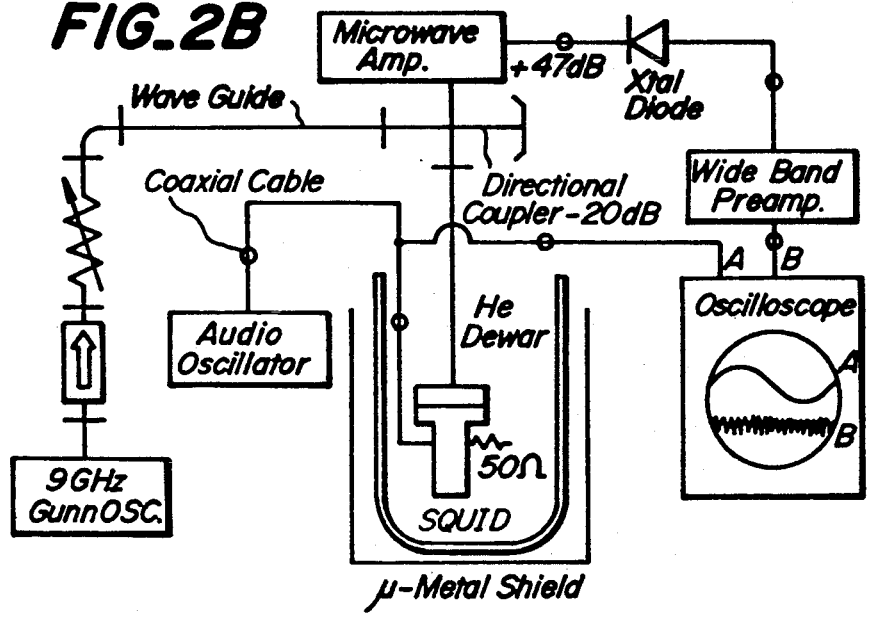
FIG. 2B is a block diagram of the measuring system with the device of FIG. 2A.
Figure 2C:
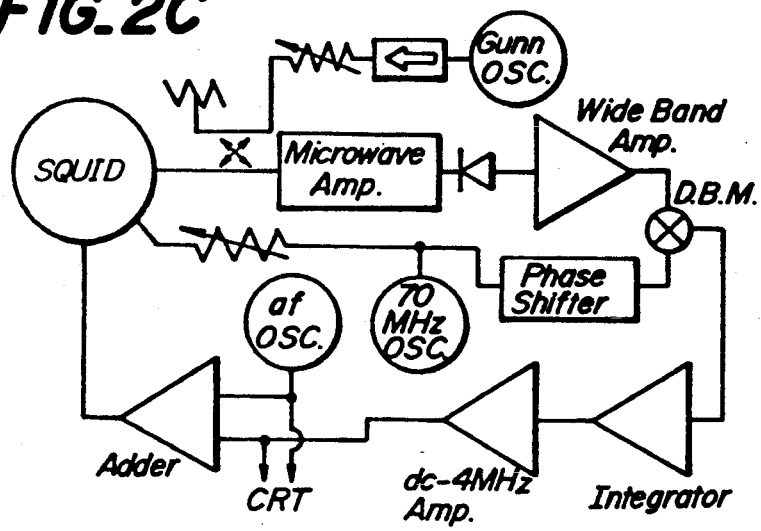
FIG. 2C is a block diagram of the feedback system with the device of FIG. 2A.

Static magnetic susceptibility or magnetization itself was measured in weak fields up to H$\simeq$50 Oe by using a microwave SQUID (Superconducting Quantum Interference Device) at 9 GHz as shown in FIG. 2A and FIG. 2B. The system was normally operated in the mode locked to the Q-pattern as shown in FIG. 2C. The bandwidth of the system covered from d.c. to 200 kHz, and the slew rate was set at about $10^4$ $\phi_o$/sec.

Spectral responses were studied by selecting the wavelength $\lambda$ from a dye laser with a resolution $\Delta \lambda = 1$ nm while using an appropriate normalization procedure for incident power from the laser and spectral sensitivity of the pyroelectric detector. A possibility of heating of the specimens by light excitation was minimized and estimated to be negligible. Photocarrier density was of the order of ($10^6$ to $10^8$)/cm$^3$ averaged over a specimen. All photosignals were normally detected in the synchronized mode by using the Boxcar integrator.

Experimental Results

The inventors observed definite signals of photoconductivity of specimen No. S22 $Y_3$—$Cu_6$—$O_z$ and all specimens $Y_{3-x}$—$Ba_x$—$Cu_3$—$O_z$ except No. S20 (with x=2) by using the transient pulse technique described above.

Firstly, the dependence of photoconductivity $Q(\lambda,T,E,H)$ on E was found to be almost linear up to E$\simeq$5 kV/cm at 77 K. No appreciable magnitude of the transverse and longitudinal magneto-resistance in $Q(\lambda,T,E,H)$ has been observed up to H$\simeq$15 kOe at 77 K. FIG. 3A illustrates a typical spectrum of pulse-excited transient photoresponse $Q(\lambda,T)$ of specimen No. S22 $Y_3$—$Cu_6$—$O_z$ (z being about 10.5) over wavelengths 460 to 640 nm, FIG. 3B illustrates a similar spectrum of specimen No. S61 $Y_3$—$Cu_3$—$O_z$ (z being about 7.5), and FIG. 3C illustrates a similar spectrum of specimen No. S21 $Y_2$—$Ba_1$—$Cu_3$—$O_z$ (z being about 6.6). The inset of FIG. 3A illustrates well established reference data of photocurrent in $Cu_2O$ reported by Gross.

Secondly, it was confirmed that the magnetizations M(T,H) of specimen No. S22 $Y_3$—$Cu_6$—$O_z$ (z being about 10.5) and specimen No. S61 $Y_3$—$Cu_3$—$O_z$ (z being about 7.5) were clearly paramagnetic or at least positive at 4.2 K and H=48 Oe, as shown in FIGS. 4C and 4D respectively. Most remarkably, the values of magnetizations M(T,H) of specimen No. S20 $Y_1$—$Ba_2$—$Cu_3$—$O_z$ and particularly even specimen No. S21 $Y_2$—$Ba_1$—$Cu_3$—$O_z$ (z being about 6.6) at 4.2 K definitely as shown in FIGS. 4 A and 4B, respectively, indicated negative diamagnetic signals which were characteristic to superconducting specimens. The magnitude of magnetization of specimen No. S21 was about one thirtieth (1/30) of that of specimen No. S20.

Figure 5A:
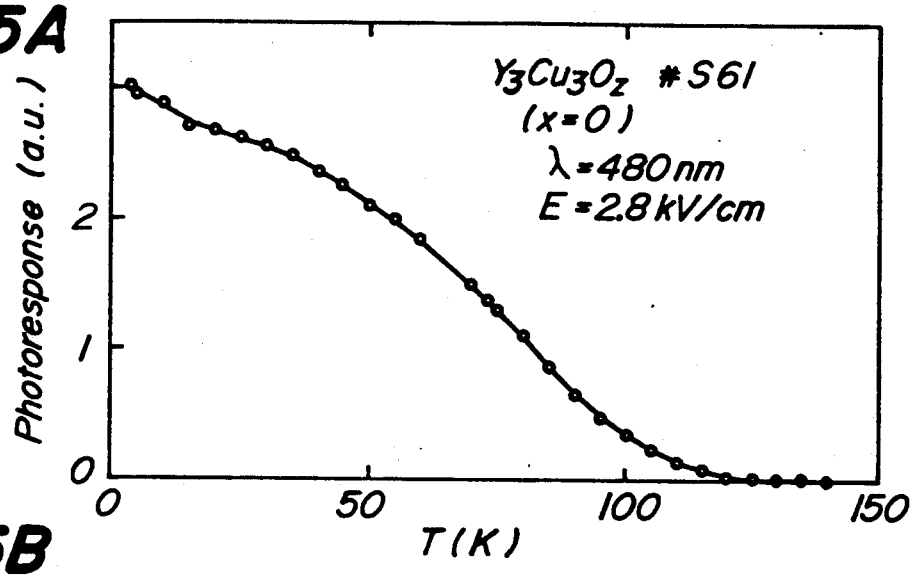
FIG. 5A is a graph showing the temperature-dependence of photoconductive response $Q(\lambda, T)$ of the superconductive photoconductive-substance $Y_{3-x}$—$Ba_x$—$Cu_y$—$O_z$ for the case of $x=0$, $y=3$ and $z\simeq7.5$.
Figure 5B:
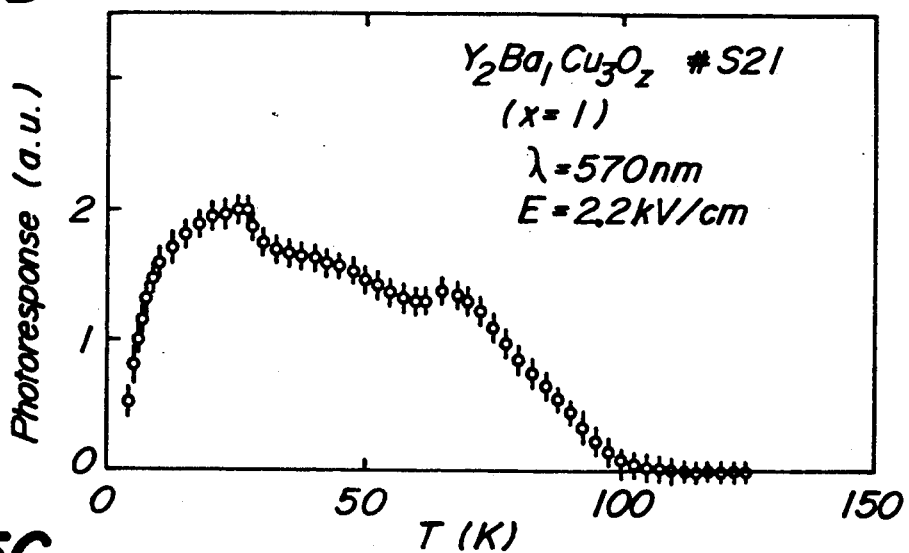
FIG. 5B is a similar graph as FIG. 5A except for the case of $x=1$, $y=3$ and $z\simeq6.6$.

Thirdly, temperature dependence of the pulse-excited transient photoresponse $Q(\lambda,T)$ in the region between $\lambda \simeq 420-640$ nm, i.e., the visible wavelength region, were studied both for an insulating specimen No. S61 and for a superconducting specimen No. S21 as illustrated in FIG. 5A and FIG. 5B, respectively. Surprisingly, there definitely exists a remarkable similarity between general features of the transient photoresponse $Q(\lambda,T)$ for No. S61 and No. S21, regardless of the huge difference in dark resistivity $\rho(T)$ as illustrated only for No. S21 in FIG. 5C. Dark resistivity $\rho(T)$ of No. S61 is too large to be shown. As the temperature decreases, it is clearly recognized that "photoconductivity" starts to reveal in the proximity of 100 K, assumes maximum value at 70-80 K and maintains a comparatively flat level until about 10 K, and then the transient photoresponse $Q(\lambda,T)$ rapidly decreases for superconducting specimen No. 21 whereas it still increases for insulating specimen No. 61.

Figure 5C:
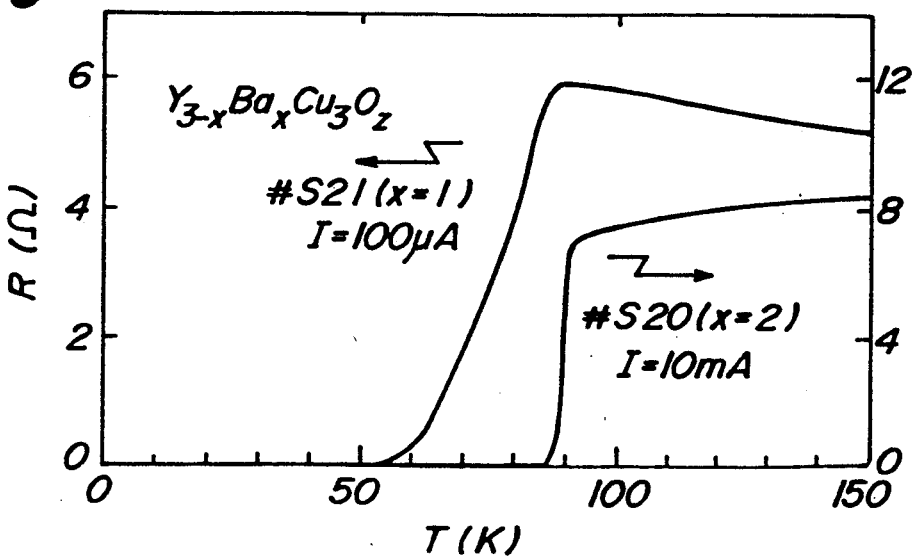
FIG. 5C is a graph showing the temperature-dependence of dark resistance R (T) of the superconducting photoconductive-substance and superconducting substance $Y_{3-x}$—$Ba_x$—$Cu_y$—$O_z$ for both the case of $x=1$, $y=3$ and $z\simeq6.6$, and the case of $x=2$, $y=3$ and $z\simeq6.9$, respectively.

Finally, the resistivity $\rho(T)$ in the dark of the Superconducting specimen No. S21 $Y_2$—$Ba_1$—$Cu_3$-$O_z$ and that of specimen No. S20 $Y_1$—$Ba_2$—$Cu_3$—$O_z$ are displayed in FIG. 5C as functions of temperature T(K). One immediately notices that both of those specimens become superconductive below $T_c$=50-90 K. No photoconductive signals of photoresponse $Q(\lambda,T)$ have been observed for the specimen No. S20.

It is by no means easy to interpret these facts. At 300 K, the specimen No. S22 $Y_3$—$Cu_6$—$O_z$ and No. S61 $Y_3$—$Cu_3$—$O_2$ are clearly insulators and the specimen No. S21 $Y_2$—$Ba_1$—$Cu_3$—$O_z$ is semiconductive. In the specimen No. S21, the photoconductivity observed with the blocking electrodes is compatible with superconductivity as illustrated in FIG. 5B probably due to the insulating part of specimen No. S21 as also noted via the value of magnetization. Surprisingly, there exists an occurrence of photoconductivity potentially correlative with superconductivity underlying even in insulating specimen No. S61 as displayed in FIG. 5A.

DISCUSSION

It is a widely recognized fact that the specimens $Y_{3-x}$—$Ba_x$—$Cu_3$—$O_z$ such as No. S21 usually have dark green colors. A specimen of $Y_3$—$Cu_6$—$O_z$ such as No. S22 looks blue-green. The spectral response of photoconductivity $Q(\lambda,T)$ in FIGS. 3A, 3B and 3C strongly suggests that there exists a region of the $Cu_2O$-like state at least in the specimen of $Y_3$—$Cu_6$13 $O_z$ and possibly even in those of $Y_{3-x}$—$Ba_x$—$Cu_3$—$O_z$, if not atomic layers. As the signals $Q(\lambda,T)$ are clearly observed, one has to recognize that either conduction electrons or positive holes or even both are mobile in insulating Y—Cu—O and Y—Ba—Cu—O specimens. The sign of the photoresponse in the Dember effect indicates that the dominant photocarriers are positive holes.

Optical absorption and photoconductivity of $Cu_2O$ have been thoroughly analyzed in terms of the exciton theory. We can recognize a few fine structures due to the excitons in the spectra of $Q(\lambda)$ both of $Y_3$—$Cu_6$—$O_z$ and of $Y_{3-x}$—$Ba_x$—$Cu_3$—$O_z$ similar to those of $Cu_2O$. Thus, we can reasonably conceive that there exists at least a finite fraction of the $Cu_2O$-like phase which cannot be ignored in the Y—Cu—O and Y—Ba—Cu—O systems where the photoexcited electrons and holes are definitely mobile, irrespective of a certain difference of the crystal structures. Data obtained by experiments of XPS (X-ray Photoelectronic Spectrography), EXAFS (Extended X-ray Absorption Fine Structures) and XANES (X-ray Absorption Near Edge Structures) revealed the existence of monovalent $Cu^{1+}$ ions besides divalent $Cu^{2+}$ ions, and trivalent $Cu^{3+}$ ions. Results of the energy band calculation and an evaluation of the density of states (DOS) also indicate similar tendencies.

A conduction electron or a positive hole in standard types of $Cu_2O$ crystals has been reported to have a rather weak coupling constant $\alpha$ with the LO-phonons ($\alpha=0.14-0.18$, being rather large as compared with that of regular III, IV group semiconductors) in the polaron formation, which results in a "large polaron". Actually, the cyclotron resonances of conduction electrons and positive holes have been observed at 1.2-20 K. On the other hand, however, it must have a much larger effective dielectric constant $\kappa$ and a coupling constant $\alpha$ in the $Cu_2O$-like part, possibly enhanced due to an order of oxygen vacancy in the $Y_3$—$Cu_6$—$O_z$ and $Y_{3-x}$—$Ba_x$—$Cu_3$—$O_z$ specimens as a series of ferroelectric materials with a large static dielectric constant. Originally, Müller with Bednorz started to study oxides which are likely to have strong electronphonon interaction and are good candidates for polaron formation due to lattice deformation caused by the Jahn-Teller effect. The dynamical effects of the polaron, whether it is a "large polaron" with the LO-phonons, a "small polaron" due to the Jahn-Teller effect or possibly an intermediate one due to both effects, they must be substantial as well as the "electronic polaron effect". They, i.e., those polarons due to phonons and due to electrons, are probably effective in a coherently hybridized form of these elementary excitations.

Therefore, we may reasonably conceive of potential roles of an ensemble of polarons, whether large or small, and excitons in the phenomena of superconductivity here. The ensemble of united polarons and excitons are probably a set of bipolarons, polaronic excitons and/or excitonic polarons due to the dynamical electron-phonon and electron correlation effects. These polarons and excitons had yielded out of the optical transition from the hybridized 2p-Oxygen and 3d-Cu valence bands leaving $(3d)^9$ positive holes to the 4s-Cu conduction band creating a $(4s)^1$ conduction electron together with the LO-phonon interaction. A polaron can be created either by the optical excitation here or substitution of Y by Ba especially in the Y—Cu—O system. As indicated in FIG. 5A, photosignals or photoresponse $Q(\lambda,T)$ in the Y—Cu—O system reflect the occurrence of superconductivity in the Y—Ba—Cu—O system. Similar phenomena have been observed also in the La—Cu—O systems. Consequently, the inventor believes that these studies of elementary excitations here must reveal the nature of the superconducting ground state. To the best knowledge of the inventor, this is the first clear experimental indications of the polaron and exciton mechanism, i.e., "the exiton-mediated bipolaron mechanism", displayed in the high-$T_c$ superconductivity and the perfect diamagnetism.

EFFECT OF THE INVENTION

As described in detail in the foregoing, the inventor has observed, for the first time, an unexpected accordance of the onsets of profound significance, i.e., "correlation of photoconductivity with superconductivity and perfect diamagnetism", at least in substance with a chemical formula of $Y_{3-x}$—$Ba_x$—$Cu_y$—$O_z$, x being 0 to 1, y being 3 to 6, and z being 6 to 12. A method for producing the above substance has been also developed.

It should be noted that the invention is an outcome of theoretical and experimental studies on the "dynamical mechanism of polarons and excitons" for "high temperature superconductivity" s proposed by the inventor. The proposed substance of the invention will open a new scientific and industrial field, to be named as "Superconductive Opto Electronics", wherein superconductivity is directly controlled by light.

Although the invention has been described with a certain degree of particularity, it must be understood that the present disclosure has been made only by way of example and that further numerous changes in details may be resorted to without departing from the scope of the invention as hereinafter claimed.

What is claimed is:

1. A method for producing a photoconductive-substance of the formula $Y_{3-x}Ba_x$—$Cu_y$—$O_z$ wherein x is 0 to 1, y is 3 to 6, and z is 6 to 12, comprising the steps of:
    (a) heating a mixture of starting materials selected from the group consisting of $Y_2O_3$, $BaCO_3$, CuO and mixtures thereof at 1,000°–1,050° C. for 1-10 hours to cause a solid phase reaction in said mixture;
    (b) gradually cooling the resulting heated mixture of step (a);
    (c) shaping the resulting cooled mixture of step (b) under pressure;
    (d) sintering the resulting shaped mixture of step (c) at 1,000°–1,050° C.; and
    (e) cooling the resulting sintered substance of step (d) at a rate of 2,000°–900° C./sec,
    wherein the resulting substance is an insulator in the dark at a temperature below 90°–95° K. and exhibits photoconductivity which is generated by exciting with a light within a wavelength range of 420 to 640 nm at a temperature below 90°–95° K.

2. The method for producing a photoconductive-substance according to claim 1, wherein after step (d) and before step (e), additional step (d)' below is employed:
    (d)' annealing the resulting sintered shaped article of step (d) at 600°–700° C. for two hours.

3. A method for producing a photoconductive-substance of formula $Y_{3-x}Ba_x$—$Cu_y$—$O_z$ wherein x is 0 to 1, y is 3 to 6, and z is 6 to 12 , comprising the steps of:
    (a) heating a mixture of starting materials selected from the group consisting of $Y_2O_3$, $BaCO_3$ and CuO and mixtures thereof at 1,000°–1,050° C. for 1-10 hours to cause a solid phase reaction in said mixture;
(b) gradually cooling the resulting heated mixture of step (a);
(c) shaping the resulting cooled mixture of step (b) under pressure;
(d) sintering the resulting shaped mixture of step (c) at 1,000°–1,050° C.; and
(e) cooling the resulting sintered substance of step (d) at a rate of 150°–200° C./hour, wherein the resulting substance is a semiconductor in the dark at a temperature below 90°–95° K. and exhibits photoconductivity which is generated by exciting with a light within a wavelength range of 420 to 640 nm at a temperature below 90°–95° K.

* * * * *